United States Patent
Murata et al.

(10) Patent No.: US 7,456,493 B2
(45) Date of Patent: Nov. 25, 2008

(54) STRUCTURE FOR MOUNTING SEMICONDUCTOR PART IN WHICH BUMP AND LAND PORTION ARE HARDLY DETACHED FROM EACH OTHER AND METHOD OF MANUFACTURING MOUNTING SUBSTRATE USED THEREIN

(75) Inventors: Shinji Murata, Fukushima-ken (JP); Masayoshi Takeuhi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 421 days.

(21) Appl. No.: 11/385,582

(22) Filed: Mar. 20, 2006

(65) Prior Publication Data
US 2006/0231953 A1    Oct. 19, 2006

(30) Foreign Application Priority Data
Apr. 15, 2005   (JP)   ............................. 2005-118432

(51) Int. Cl.
*H01L 23/495*   (2006.01)
(52) U.S. Cl. ................ 257/676; 257/738; 257/E23.021
(58) Field of Classification Search ................ 257/673, 257/676, 738, E23.069, E23.07, E23.021
See application file for complete search history.

(56) References Cited

U.S. PATENT DOCUMENTS 6,400,019 B1 *   6/2002   Hirashima et al. .......... 257/737
6,472,608 B2 *   10/2002   Nakayama .................. 174/255
2002/0048847 A1 *   4/2002   Tsunoi et al. ............... 438/108
2005/0208749 A1 *   9/2005   Beckman et al. ............ 438/613

FOREIGN PATENT DOCUMENTS

JP   11-40940   2/1999

* cited by examiner

*Primary Examiner*—Trung Dang
(74) *Attorney, Agent, or Firm*—Beyer Law Group LLP

(57) ABSTRACT

There is provided a structure for mounting a semiconductor part having improved productivity, in which a bump is detached from a land portion and a method of manufacturing a mounting substrate used therein. The structure for mounting the semiconductor part includes a mounting substrate 1 having an insulating substrate 2 on which a wiring pattern 3 and a land portion 4 are provided, a semiconductor part 5 mounted on the mounting substrate 1 using a bump 7 and the land portion 4, and an underfill 8 inserted between the semiconductor part 5 and the insulating substrate 2. An undercut portion 4c having an inverse tapered shape from the insulating substrate 2 to an upper surface of the land portion 4 is provided in an edge 4a of the land portion 4 in which the bump 7 is located, and the bump is inserted into the undercut portion. Accordingly, since the couple between the bump 7 and the land portion 4 becomes stronger, the bump is not detached from the land portion 4 when the underfill 8 expands or contracts.

8 Claims, 8 Drawing Sheets

STRUCTURE FOR MOUNTING SEMICONDUCTOR PART IN WHICH BUMP AND LAND PORTION ARE HARDLY DETACHED FROM EACH OTHER AND METHOD OF MANUFACTURING MOUNTING SUBSTRATE USED THEREIN

BACKGROUND OF THE INVENTION

1. Field of the Invention

The present invention relates to a structure for mounting a semiconductor part adapted for various kinds of electronic devices or electronic circuit units and a method of manufacturing a mounting substrate used therein.

2. Description of the Related Art

A conventional structure for mounting a semiconductor part will be described with reference to the accompanying drawings. FIG. 15 is an enlarged cross-sectional view of main parts related to the conventional structure for mounting the semiconductor part and FIG. 16 is a plan view of main parts of a mounting substrate, for illustrating a configuration of a land portion in the conventional structure for mounting the semiconductor part.

Next, a configuration related to the conventional structure for mounting the semiconductor part will be described with reference to FIGS. 15 and 16. A mounting substrate 51 includes an insulating substrate 52, a wiring pattern 53 provided on the insulating substrate 52, and a land portion 54 provided at an end of the wiring pattern 53.

The wiring pattern 53 and the land portion 54 are simultaneously formed by etching a metal film and the land portion 54 includes a plurality of island portions 54a. An edge of each island portion 54a forms a vertical plane from the insulating substrate 52 to an upper surface of the island portion.

A plurality of electrodes 56 are provided on a lower surface of the semiconductor part 55 and bumps 57 are attached to the electrodes 56. The bumps 57 attached to the electrodes 56 are thermally compressed on the land portion 54 such that the semiconductor part 55 is mounted on the mounting substrate 51.

Furthermore, an underfill 58 is inserted between the lower surface of the semiconductor part 55 and an upper surface of the insulating substrate 52 to strongly mount the semiconductor part 55, thereby configuring the conventional structure for mounting the semiconductor part (For example, see Patent Document 1).

However, in the conventional structure for mounting the semiconductor part, since the bump 57 is attached to the land portion 54 in a state that the edge of the island portion 54a of the land portion 54 forms the vertical plane, when the underfill 58 expands or contracts, the bump 57 is detached from the land portion 54.

In addition, in a conventional method of manufacturing the mounting substrate 51, since the wiring pattern 53 and the land portion 54 are formed by etching the metal film provided on the insulating substrate 52, the edge of the island portion 54a of the land portion 54 forms the vertical plane. Thus, when the underfill 58 expands or contracts in a state that the bump 57 is attached to the land portion 54, the bump 57 is detached from the land portion 54.

In the conventional structure for mounting the semiconductor part, since the bump 57 is attached to the land portion 54 in the state that the edge of the island portion 54a of the land portion 54 forms the vertical plane, there is a problem that, when the underfill 58 expands or contracts, the bump 57 is detached from the land portion 54.

In addition, in a conventional method of manufacturing the mounting substrate 51, since the wiring pattern 53 and the land portion 54 are formed by etching the metal film provided on the insulating substrate 52, the edge of the island portion 54a of the land portion 54 forms the vertical plane. Thus, there is a problem that, when the underfill 58 expands or contracts in the state that the bump 57 is attached to the land portion 54, the bump 57 is detached from the land portion 54.

SUMMARY OF THE INVENTION

Accordingly, an object of the present invention is to provide a structure for mounting a semiconductor part having improved productivity, in which a bump is detached from a land portion and a method of manufacturing a mounting substrate used therein.

According to an aspect of the present invention, there is provided a structure for mounting a semiconductor part including a mounting substrate having an insulating substrate on which a wiring pattern and a land portion are provided, a semiconductor part mounted on the mounting substrate using a bump and the land portion, and an underfill inserted between the semiconductor part and the insulating substrate, wherein an undercut portion having an inverse tapered shape from the insulating substrate to an upper surface of the land portion is provided in an edge of the land portion in which the bump is located, and the bump is inserted into the undercut portion.

The land portion may have at least a pair of edges which face each other at an interval and the bump may be inserted into the undercut portion provided in the pair of edges.

The land portion may have at least a pair of edges which face each other at an interval, a groove which is provided between the edges and formed by removing the land portion, and an opening provided in at least one end of the groove, and the underfill inserted in the groove may flow out through the opening.

The bump may be made of gold.

The land portion may include an underlying layer which is provided on the insulating substrate and made of metal having high conductivity, a first upper layer which is provided on the underlying layer and made of metal harder than the underlying layer, and a second upper layer which is provided on the first upper layer and made of gold.

The underlying layer may be made of copper, an alloy mainly consisting of copper, silver, or an alloy mainly consisting of silver, and the upper layer may be made of nickel.

According to a second aspect of the present invention, there is provided a method of manufacturing a mounting substrate used in a structure for mounting a semiconductor part, wherein the mounting substrate is manufactured by forming an underlying layer made of metal on the insulating substrate, forming a resist which can be developed on the underlying layer, developing the resist to form grooves in a desired pattern shape at positions which becomes the wiring pattern and the land portion, heating the resist to round upper corners of the resist, forming a upper layer made of metal in the grooves in a state that the resist is attached to the underlying layer, removing the resist, and removing the underlying layer except portions on which the upper layer is located, the wiring pattern and the land portion are formed of the underlying layer and the upper layer, and the undercut portion is formed by removing the resist and the underlying layer except portions on which the upper layer is located.

The upper layer may be formed by plating and the underlying layer may be removed by etching.

Since the structure for mounting the semiconductor part includes a mounting substrate having an insulating substrate on which a wiring pattern and a land portion are provided, a semiconductor part mounted on the mounting substrate using a bump and the land portion, and an underfill inserted between the semiconductor part and the insulating substrate, an undercut portion having an inverse tapered shape from the insulating substrate to an upper surface of the land portion is provided in an edge of the land portion in which the bump is located, and the bump is inserted into the undercut portion, the couple between the bump and the land portion becomes stronger, the bump is not detached from the land portion when the underfill expands or contracts.

Furthermore, since the land portion has at least a pair of edges which face each other at an interval and the bump is inserted into the undercut portion provided in the pair of edges, the couple between the bump and the land portion becomes stronger, the bump is not detached from the land portion when the underfill expands or contracts.

In addition, since the land portion has at least a pair of edges which face each other at an interval, a groove which is provided between the edges and formed by removing the land portion, and an opening provided in at least one end of the groove, and the underfill inserted in the groove flows out through the opening, the underfill can be easily flow out of the groove.

Moreover, since the bump is made of gold, a conduction state between the bump and the land portion is more improved and the bump is easily inserted into the undercut portion.

In addition, since the land portion includes an underlying layer which is provided on the insulating substrate and made of metal having high conductivity, a first upper layer which is provided on the underlying layer and made of metal harder than the underlying layer, and a second upper layer which is provided on the first upper layer and made of gold, deformation of the first upper layer due to a force generated when the bump is inserted is low and the bump can be surely inserted into the undercut portion.

Furthermore, since the underlying layer is made of copper, an alloy mainly consisting of copper, silver, or an alloy mainly consisting of silver, it is possible to increase conductivity. In addition, since the upper layer is made of nickel, the first upper layer becomes stronger and thus deformation of the first upper layer due to a force generated when the bump is inserted is low and the bump can be surely inserted into the undercut portion.

Moreover, in the method of manufacturing a mounting substrate used in a structure for mounting a semiconductor part, since the mounting substrate is manufactured by forming an underlying layer made of metal on the insulating substrate, forming a resist which can be developed on the underlying layer, developing the resist to form grooves in a desired pattern shape at positions which becomes the wiring pattern and the land portion, heating the resist to round upper corners of the resist, forming a upper layer made of metal in the grooves in a state that the resist is attached to the underlying layer, removing the resist, and removing the underlying layer except portions on which the upper layer is located, the wiring pattern and the land portion are formed of the underlying layer and the upper layer, and the undercut portion is formed by removing the resist and the underlying layer except portions on which the upper layer is located, it is possible to surely form the undercut portion in the edge of the land portion and to improve productivity.

Moreover, since the upper layer is formed by plating and the underlying layer is removed by etching, a process can be easily performed and productivity is improved.

DESCRIPTION OF THE PREFERRED EMBODIMENT

Figure 1:
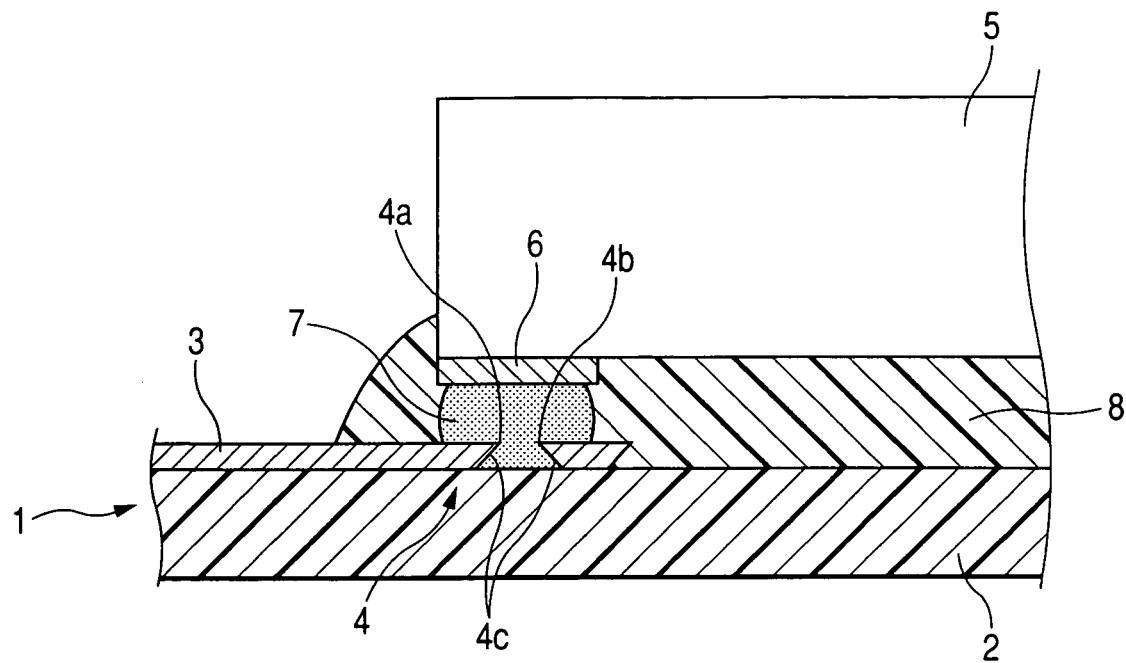
FIG. 1 is an enlarged cross-sectional view of main parts related to a structure for mounting a semiconductor part according to a first embodiment of the present invention.
Figure 2:
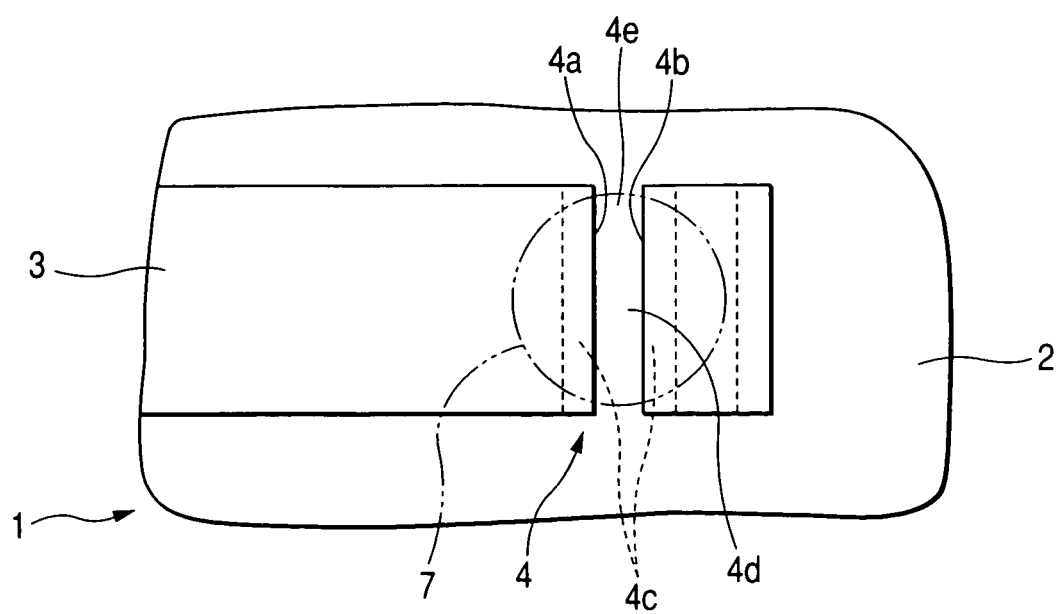
FIG. 2 is a plan view of main parts of a mounting substrate, for illustrating a configuration of a land portion in the structure for mounting the semiconductor part according to the first embodiment of the present invention.
Figure 3:
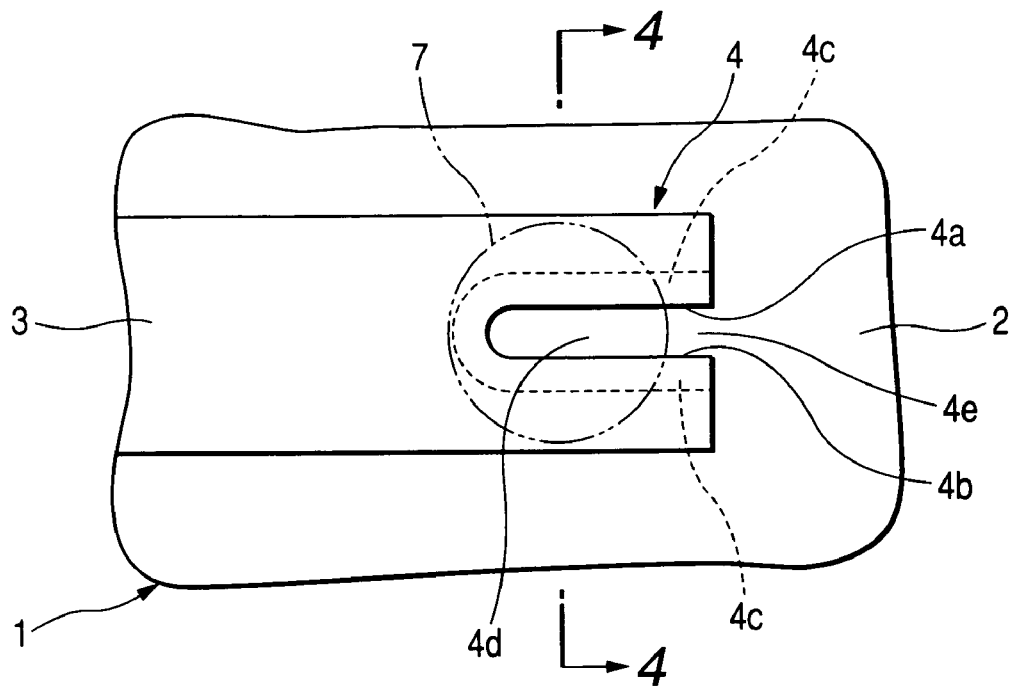
FIG. 3 is a plan view of main parts of a mounting substrate, for illustrating a configuration of a land portion in a structure for mounting a semiconductor part according to a second embodiment of the present invention.
Figure 4:
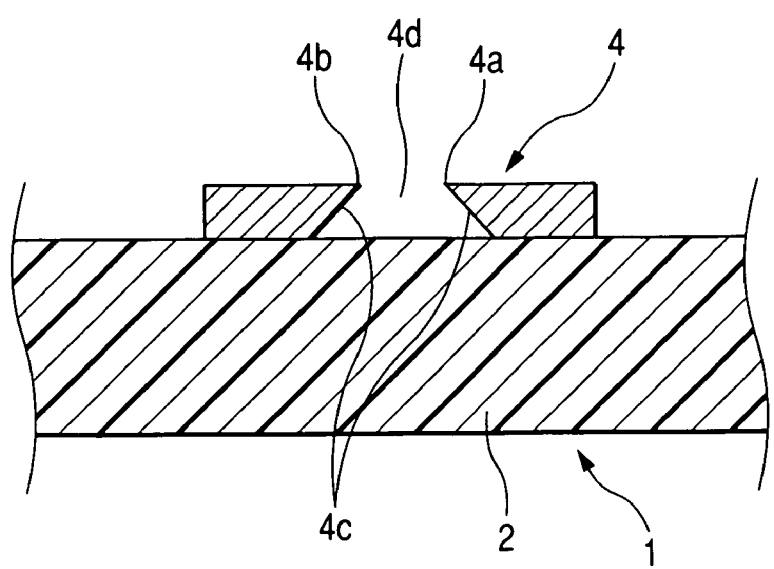
FIG. 4 is a cross-sectional view taken along line 4-4 of FIG. 3.
Figure 5:
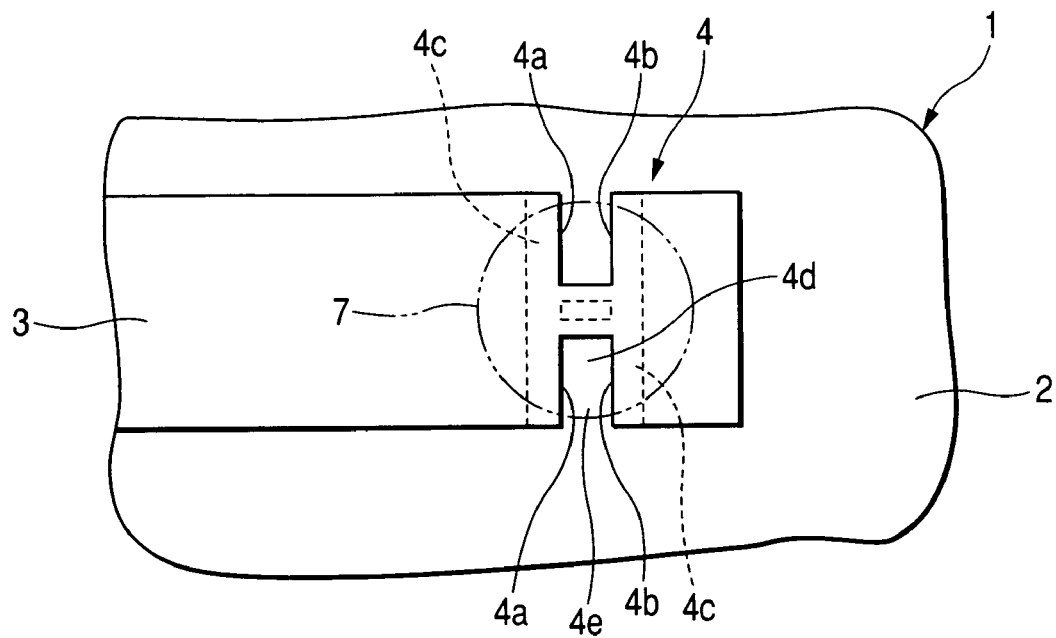
FIG. 5 is a plan view of main parts of a mounting substrate, for illustrating a configuration of a land portion in a structure for mounting a semiconductor part according to a third embodiment of the present invention.
Figure 6:
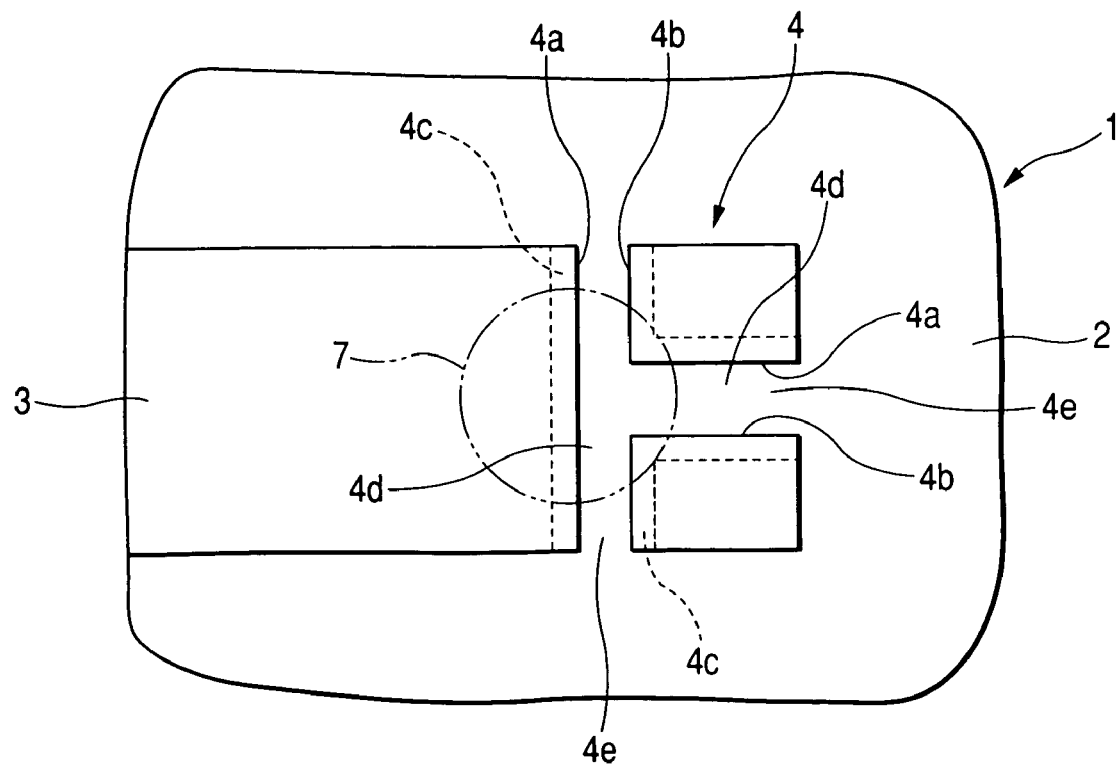
FIG. 6 is a plan view of main parts of a mounting substrate, for illustrating a configuration of a land portion in a structure for mounting a semiconductor part according to a fourth embodiment of the present invention.
Figure 7:
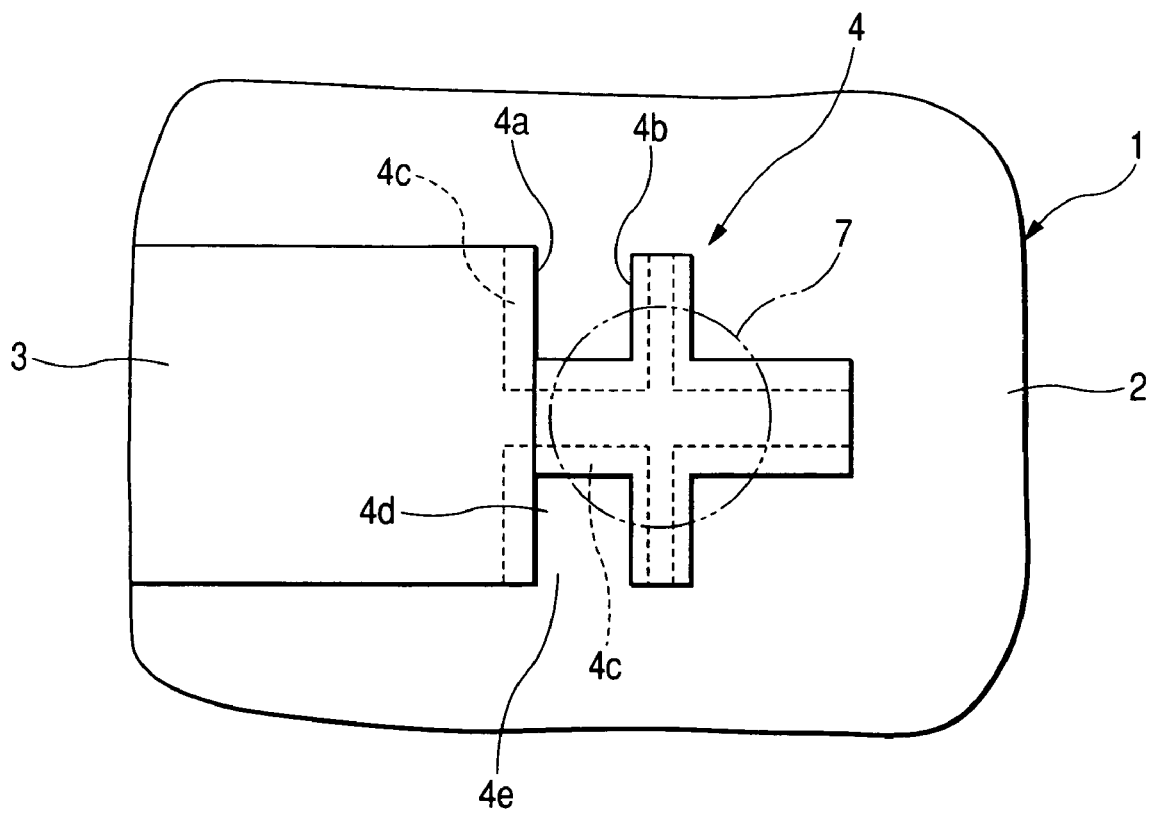
FIG. 7 is a plan view of main parts of a mounting substrate, for illustrating a configuration of a land portion in a structure for mounting a semiconductor part according to a fifth embodiment of the present invention.

Now, a structure for mounting a semiconductor part and a method of manufacturing a mounting substrate used therein according to the present invention will be described. FIG. 1 is an enlarged cross-sectional view of main parts related to a structure for mounting a semiconductor part according to a first embodiment of the present invention, FIG. 2 is a plan view of main parts of a mounting substrate, for illustrating a configuration of a land portion in the structure for mounting the semiconductor part according to the first embodiment of the present invention, FIG. 3 is a plan view of main parts of a mounting substrate, for illustrating a configuration of a land portion in a structure for mounting a semiconductor part according to a second embodiment of the present invention, FIG. 4 is a cross-sectional view taken along line 4-4 of FIG. 3, FIG. 5 is a plan view of main parts of a mounting substrate, for illustrating a configuration of a land portion in a structure for mounting a semiconductor part according to a third embodiment of the present invention, FIG. 6 is a plan view of main parts of a mounting substrate, for illustrating a configuration of a land portion in a structure for mounting a semiconductor part according to a fourth embodiment of the present invention, and FIG. 7 is a plan view of main parts of a mounting substrate, for illustrating a configuration of a land portion in a structure for mounting a semiconductor part according to a fifth embodiment of the present invention.

Figure 8:
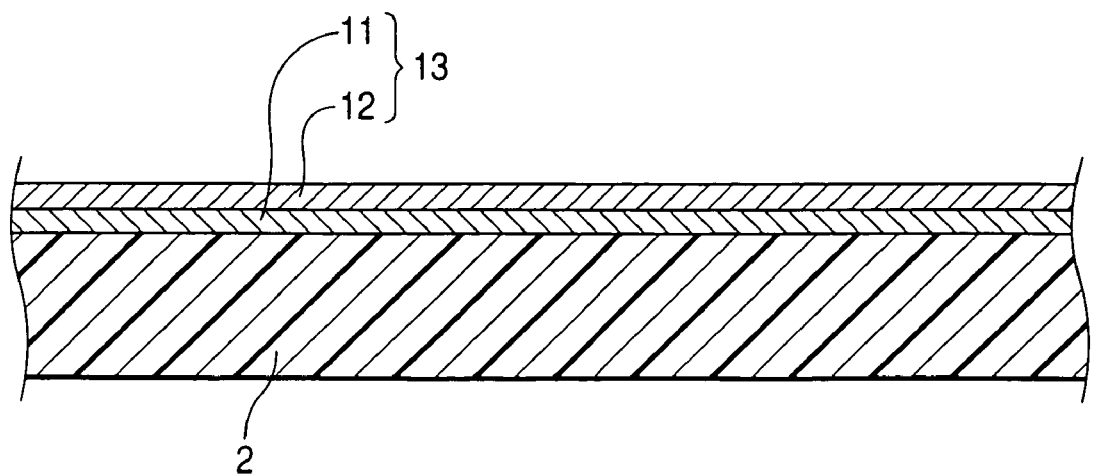
FIG. 8 illustrates a first step related to a method of manufacturing the mounting substrate used in the structure for mounting the semiconductor part according to the present invention.
Figure 9:
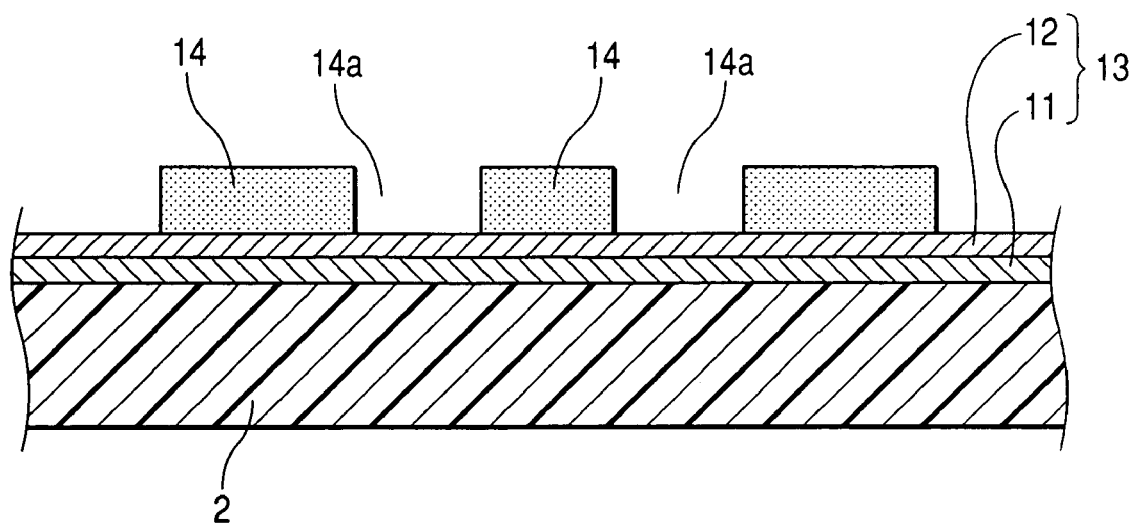
FIG. 9 illustrates a second step related to the method of manufacturing the mounting substrate used in the structure for mounting the semiconductor part according to the present invention.
Figure 10:
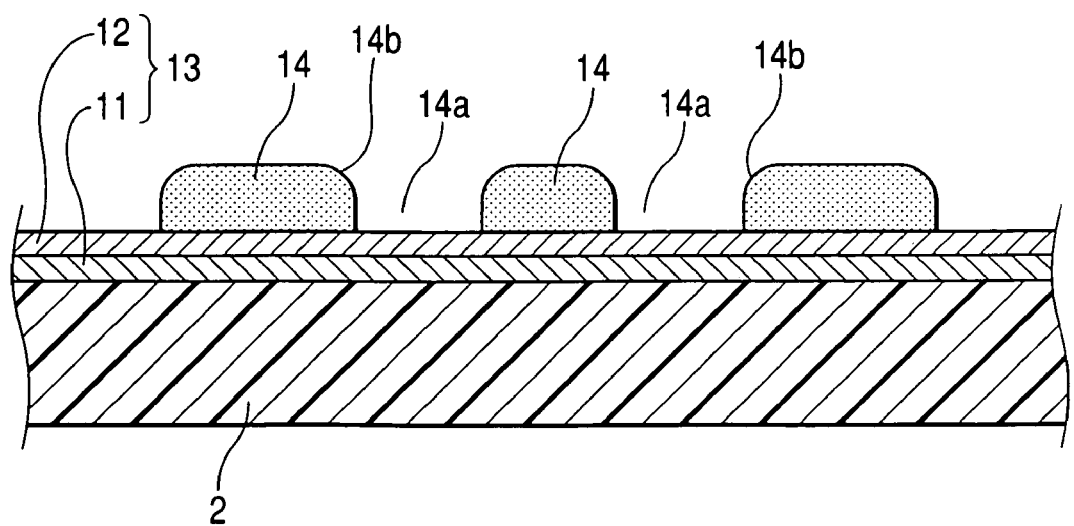
FIG. 10 illustrates a third step related to the method of manufacturing the mounting substrate used in the structure for mounting the semiconductor part according to the present invention.
Figure 11:
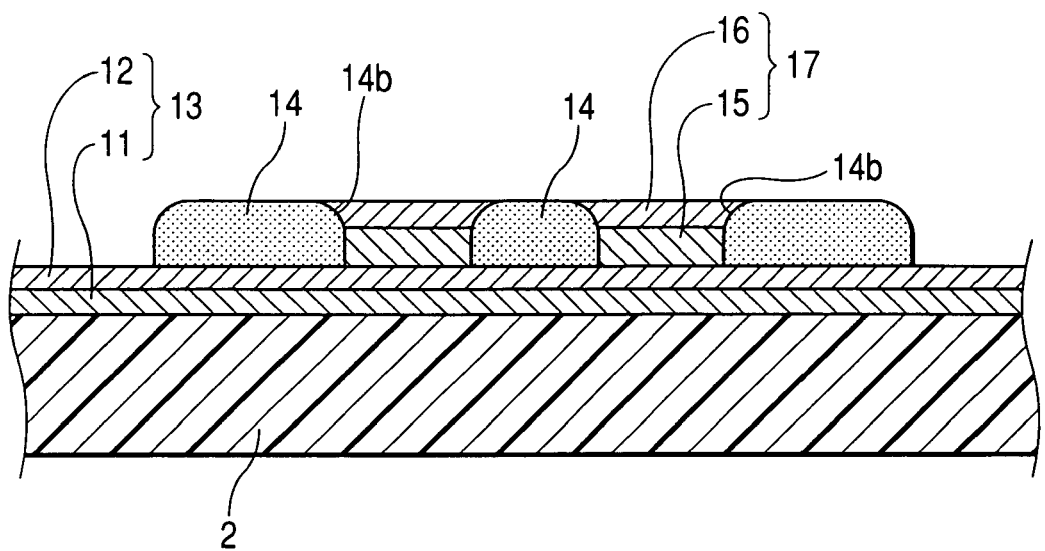
FIG. 11 illustrates a fourth step related to the method of manufacturing the mounting substrate used in the structure for mounting the semiconductor part according to the present invention.
Figure 12:
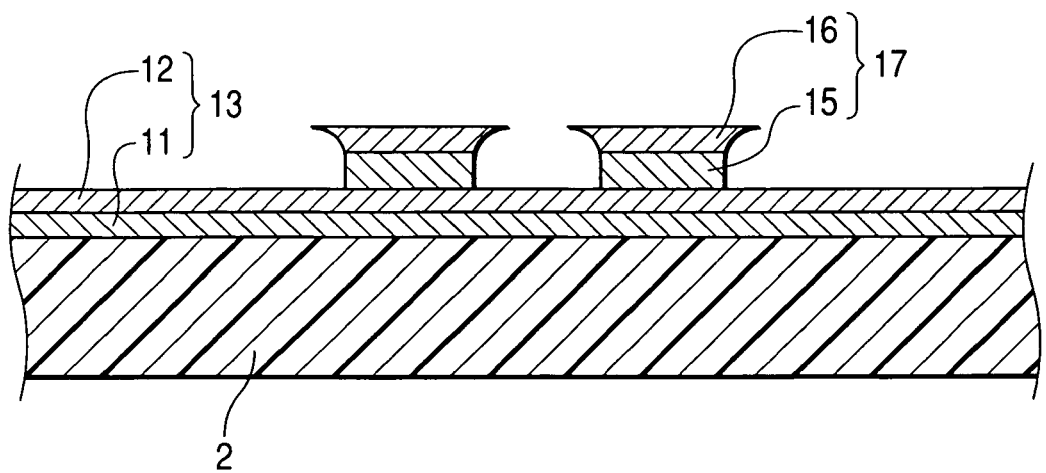
FIG. 12 illustrates a fifth step related to the method of manufacturing the mounting substrate used in the structure for mounting the semiconductor part according to the present invention.
Figure 13:
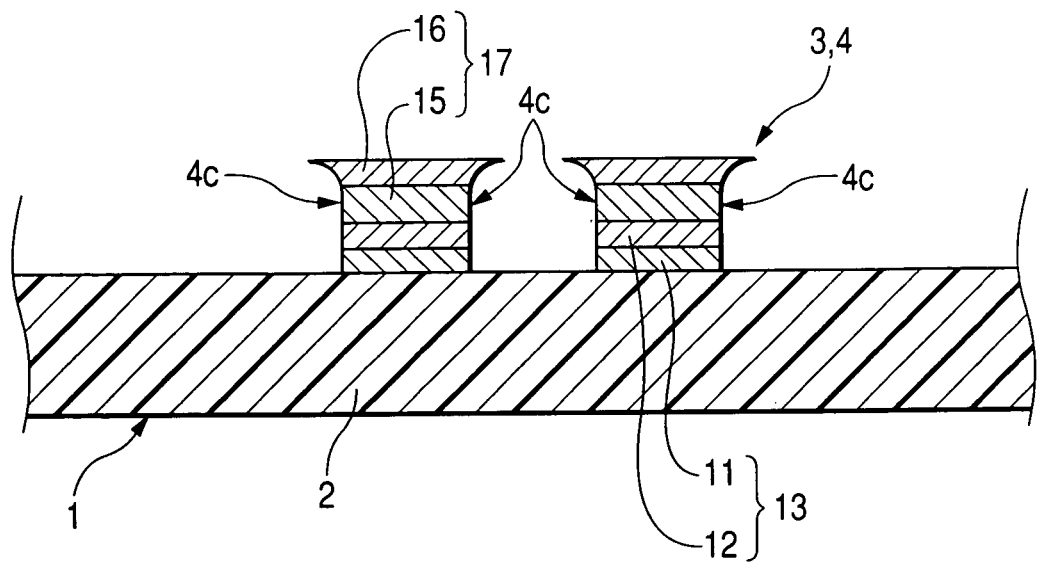
FIG. 13 illustrates a sixth step related to the method of manufacturing the mounting substrate used in the structure for mounting the semiconductor part according to the present invention.
Figure 14:
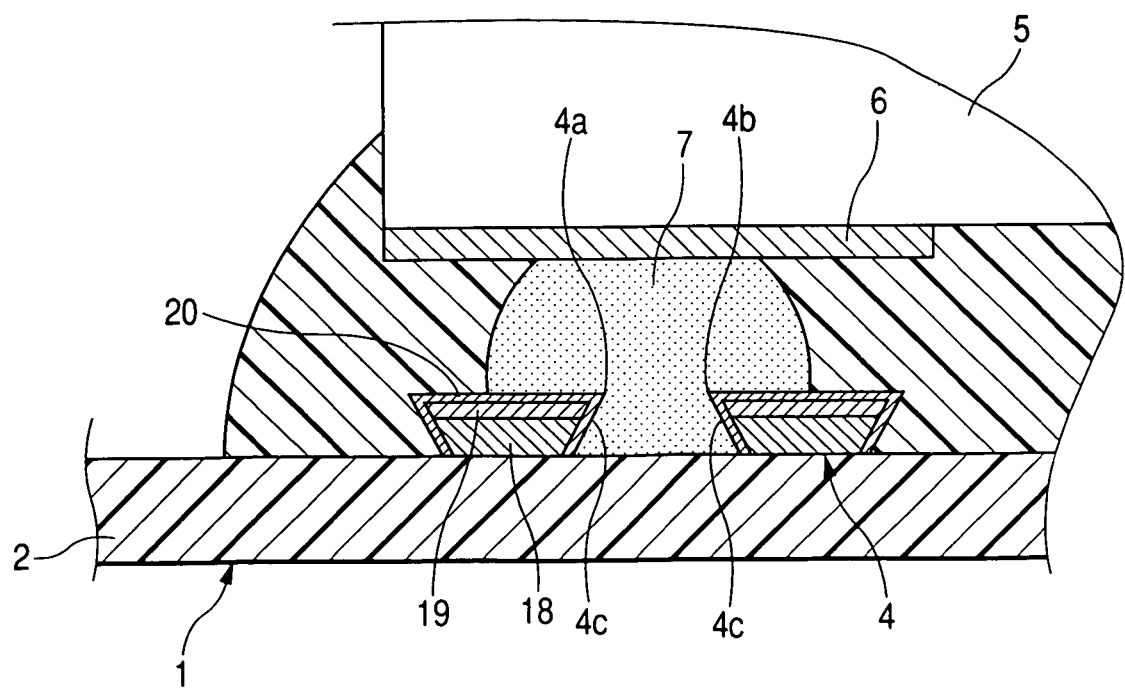
FIG. 14 is an enlarged cross-sectional view of main parts related to a structure for mounting a semiconductor part according to a sixth embodiment of the present invention.
Figure 15:
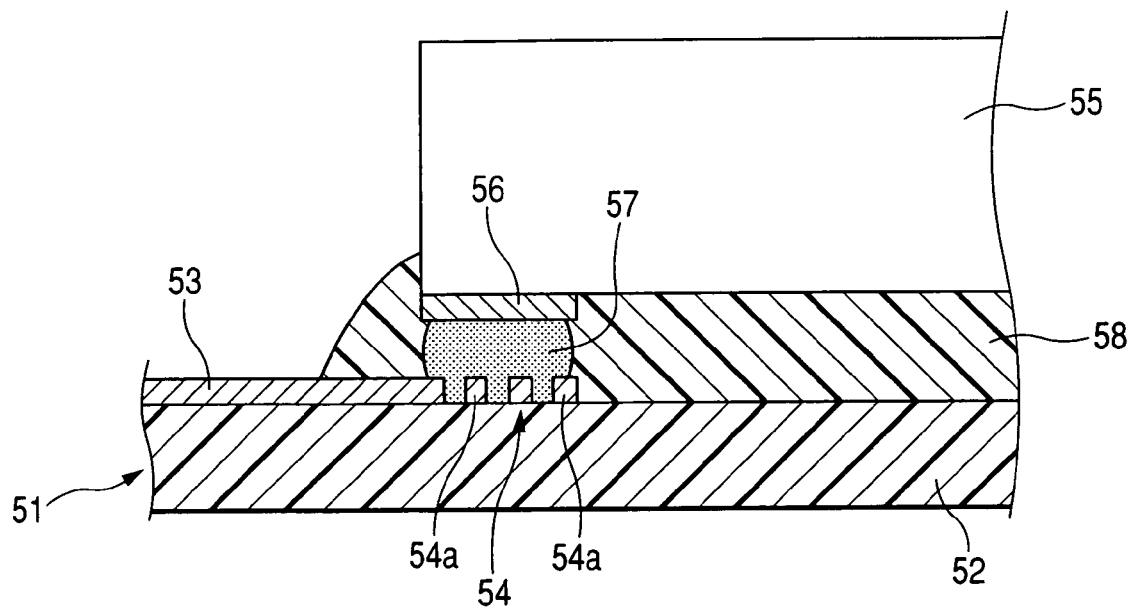
FIG. 15 is an enlarged cross-sectional view of main parts related to a conventional structure for mounting a semiconductor part.
Figure 16:
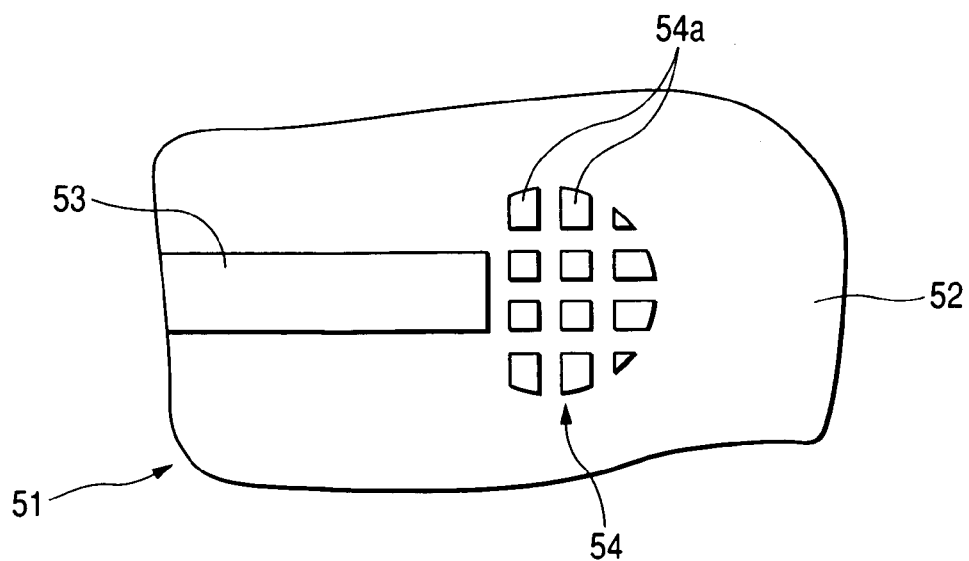
FIG. 16 is a plan view of main parts of a mounting substrate, for illustrating a configuration of a land portion in the conventional structure for mounting the semiconductor part.

In addition, FIG. 8 illustrates a first step related to a method of manufacturing the mounting substrate used in the structure for mounting the semiconductor part according to the present invention, FIG. 9 illustrates a second step related to the method of manufacturing the mounting substrate used in the structure for mounting the semiconductor part according to the present invention, FIG. 10 illustrates a third step related to the method of manufacturing the mounting substrate used in the structure for mounting the semiconductor part according to the present invention, FIG. 11 illustrates a fourth step related to the method of manufacturing the mounting substrate used in the structure for mounting the semiconductor part according to the present invention, FIG. 12 illustrates a fifth step related to the method of manufacturing the mounting substrate used in the structure for mounting the semiconductor part according to the present invention, FIG. 13 illustrates a sixth step related to the method of manufacturing the mounting substrate used in the structure for mounting the semiconductor part according to the present invention, and FIG. 14 is an enlarged cross-sectional view of main parts related to a structure for mounting a semiconductor part according to a sixth embodiment of the present invention.

Next, a configuration of the structure for mounting the semiconductor part according to the first embodiment of the present invention will be described with reference to FIGS. 1 and 2. A mounting substrate 1 includes an insulating substrate 2, a wiring pattern 3 provided on the insulating substrate 2, and a land portion 4 provided at an end of the wiring pattern 3.

In addition, the land portion 4 includes at least a pair of edges 4a and 4b which face each other at an interval and undercut portions 4c which are provided in the edges 4a and 4b and have an inverse tapered shape from the insulating substrate 2 to an upper surface of the land portion 4.

In other words, each undercut portion 4c is formed such that the area of the surface of the land portion 4 increases from the insulating substrate 2 to the upper surface of the land portion 4. In the first embodiment, two land portions 4 arranged at an interval are formed.

Furthermore, in the land portion 4, a groove 4d which is formed by removing the land portion 4 is formed between the edges 4a and 4b, and an opening 4e which is opened by removing the land portion 4 is provided in at least one end of the groove 4d.

A plurality of electrodes 6 are provided on a lower surface of a semiconductor part 5 including a semiconductor chip and bumps 7 made of gold are attached to the electrodes 6. The bumps 7 attached to the electrodes 6 are thermally compressed on the land portion 4 such that the semiconductor part 5 is mounted on the mounting substrate 1.

At this time, each bump 7 is bonded to the land portion 4 to be inserted into the undercut portions 4c which are formed in the edges 4a and 4b of the land portion 4 and have the inverse tapered shape.

Moreover, an underfill 8 is inserted between the lower surface of the semiconductor part 5 and an upper surface of the insulating substrate 2 to strongly mount the semiconductor part 5. In addition, the underfill 8 inserted in the groove 4d flows out of the groove 4d through the opening 4e, thereby configuring the structure for mounting the semiconductor part according to the present invention.

Furthermore, FIGS. 3 and 4 illustrate the structure for mounting the semiconductor part according to the second embodiment of the present invention. In the second embodiment, one end of a land portion 4 has a U shape and undercut portions 4c having an inverse tapered shape from an insulating substrate 2 to an upper surface of the land portion 4 are provided in a pair of edges 4a and 4b which face each other at an interval.

In addition, the other configurations are the same as those of the first embodiment. Thus, like elements are denoted by like reference numerals and thus their description will be omitted.

Furthermore, FIG. 5 illustrates the structure for mounting the semiconductor part according to the third embodiment of the present invention. In the third embodiment, a portion of a land portion 4 has an H shape and undercut portions 4c having an inverse tapered shape from an insulating substrate 2 to an upper surface of the land portion 4 are provided in a pair of edges 4a and 4b which face each other at an interval.

In addition, the other configurations are the same as those of the first embodiment. Thus, like elements are denoted by like reference numerals and thus their description will be omitted.

Furthermore, FIG. 6 illustrates the structure for mounting the semiconductor part according to the fourth embodiment of the present invention. In the fourth embodiment, a T-shaped groove 4d is formed in a land portion 4 and undercut portions 4c having an inverse tapered shape from an insulating substrate 2 to an upper surface of the land portion 4 are provided in a pair of edges 4a and 4b which face each other at an interval.

In addition, the other configurations are the same as those of the first embodiment. Thus, like elements are denoted by like reference numerals and thus their description will be omitted.

Furthermore, FIG. 7 illustrates the structure for mounting the semiconductor part according to the fifth embodiment of the present invention. In the fifth embodiment, a portion of a land portion 4 has a cross shape and undercut portions 4c having an inverse tapered shape from an insulating substrate 2 to an upper surface of the land portion 4 are provided in a pair of edges 4a and 4b which face each other at an interval.

In addition, the other configurations are the same as those of the first embodiment. Thus, like elements are denoted by like reference numerals and thus their description will be omitted.

Next, the method of manufacturing the mounting substrate used in the structure for mounting the semiconductor part according to the present invention will be described with reference to FIGS. 8 to 13. First, as illustrated in FIG. 8, an underlying layer 13 made of metal and including a Ti layer 11 and Cu layer 12 is formed on an insulating layer 2.

Next, a resist 14 which can be developed is formed on the underlying layer 13 and the resist 14 is then developed to form grooves 14a in a desired pattern shape at positions which become a wiring pattern 3 and a land portion 4, as illustrated in FIG. 9.

Next, as illustrated in FIG. 10, the resist 14 is heated (burned) to round the upper corners of the resist 14 (provide rounded portions 14b). Then, as illustrated in FIG. 11, an upper layer 17 made of metal and including a Cu layer 15 and a Ni layer 16 is formed in the grooves 14a by plating in a state that the resist is attached to the underlying layer 13.

Next, as illustrated in FIG. 12, the resist 14 is removed, and, as illustrated in FIG. 13, the underlying portion 13 except portions on which the upper layer 17 is located is removed, thereby completing the manufacture of the mounting substrate 1 according to the present invention.

In addition, as illustrated in FIG. 13, the wiring pattern 3 and the land portion 4 are formed of the underlying layer 13 and the upper layer 17, and the undercut portions 4c are formed by removing the resist 14 and the underlying portion 13 except portions on which the upper layer 17 is located.

FIG. 14 illustrates the structure for mounting the semiconductor part according to the sixth embodiment of the present invention. In the sixth embodiment, a land portion 4 includes an underlying layer 18 which is provided on an insulating substrate 2 and made of metal having high conductivity, and a first upper layer 19 made of metal harder than the underlying layer 18, and a second upper layer 20 provided on the first upper layer 19.

In addition, the underlying layer 18 has a thickness of 1 to 5 $\mu$ and is made of copper, an alloy mainly consisting of copper, silver, or an alloy mainly consisting of silver. Furthermore, the first upper layer 19 has a thickness of 0.3 to 3.0 $\mu$ and is made of nickel. The second upper layer 20 has a thickness of 0.03 to 1.0 $\mu$ and is made of gold.

In addition, the other configurations are the same as those of the first embodiment. Thus, like elements are denoted by like reference numerals and thus their description will be omitted.

Moreover, a method of manufacturing the mounting substrate according to the sixth embodiment is the same as the above-mentioned method, except that the materials of the underlying layer 18 and the upper layers 19 and 20 different from those of the above-mentioned method are used.

What is claimed is:

1. A structure for mounting a semiconductor part in which a bump and a land portion is hardly detached from each other, comprising: a mounting substrate having an insulating substrate on which a wiring pattern and the land portion are provided, a semiconductor part mounted on the mounting substrate using the bump and the land portion, and an underfill inserted between the semiconductor part and the insulating substrate, wherein an undercut portion having an inverse tapered shape from the insulating substrate to an upper surface of the land portion is provided in an edge of the land portion in which the bump is located, and the bump is inserted into the undercut portion.

2. The structure for mounting the semiconductor part according to claim 1, wherein the land portion has at least a pair of edges which face each other at an interval and the bump is inserted into the undercut portion provided in the pair of edges.

3. The structure for mounting the semiconductor part according to claim 1, wherein the land portion has at least a pair of edges which face each other at an interval, a groove which is provided between the edges and formed by removing the land portion, and an opening provided in at least one end of the groove, and the underfill inserted in the groove flows out through the opening.

4. The structure for mounting the semiconductor part according to claim 1, wherein the bump is made of gold.

5. The structure for mounting the semiconductor part according to claim 1, wherein the land portion comprises an underlying layer which is provided on the insulating substrate and made of metal having high conductivity, a first upper layer which is provided on the underlying layer and made of metal harder than the underlying layer, and a second upper layer which is provided on the first upper layer and made of gold.

6. The structure for mounting the semiconductor part according to claim 5, wherein the underlying layer is made of copper, an alloy mainly consisting of copper, silver, or an alloy mainly consisting of silver, and the upper layer is made of nickel.

7. A method of manufacturing a mounting substrate used in the structure for mounting the semiconductor part according to claim 1, wherein the mounting substrate is manufactured by forming an underlying layer made of metal on the insulating substrate, forming a resist which can be developed on the underlying layer, developing the resist to form grooves in a desired pattern shape at positions which becomes the wiring pattern and the land portion, heating the resist to round upper corners of the resist, forming a upper layer made of metal in the grooves in a state that the resist is attached to the underlying layer, removing the resist, and removing the underlying layer except portions on which the upper layer is located, the wiring pattern and the land portion are formed of the underlying layer and the upper layer, and the undercut portion is formed by removing the resist and the underlying layer except portions on which the upper layer is located.

8. The method according to claim 7, wherein the upper layer is formed by plating and the underlying layer is removed by etching.

* * * * *